US 9,130,108 B2

(12) United States Patent
Tsou et al.

(10) Patent No.: US 9,130,108 B2
(45) Date of Patent: Sep. 8, 2015

(54) LIGHT-EMITTING DIODE AND METHOD FOR MANUFACTURING THEREOF

(71) Applicant: Lextar Electronics Corporation, Hsinchu (TW)

(72) Inventors: Po-Hung Tsou, New Taipei (TW); Tzu-Hung Chou, Zhongli (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/274,953

(22) Filed: May 12, 2014

(65) Prior Publication Data

US 2015/0048303 A1    Feb. 19, 2015

(30) Foreign Application Priority Data

Aug. 16, 2013    (TW) .............................. 102129509 A (51) Int. Cl.
| | |
|---|---|
| *H01L 21/00* | (2006.01) |
| *H01L 31/0328* | (2006.01) |
| *H01L 27/15* | (2006.01) |
| *H01L 33/14* | (2010.01) |
| *H01L 33/00* | (2010.01) |
| *H01L 33/42* | (2010.01) |

(52) U.S. Cl.
CPC ............ *H01L 33/145* (2013.01); *H01L 33/007* (2013.01); *H01L 33/42* (2013.01)

(58) Field of Classification Search
CPC ........ B82Y 20/00; H01L 33/32; H01L 33/20; H01L 33/62; H01L 33/486; H01L 25/167; H01L 25/0753; H01L 31/173; H01L 31/167

USPC .................... 257/13, 79–82, 88, 94, E25.032, 257/E33.065; 438/22, 24–29, 47

See application file for complete search history.

(56) References Cited

U.S. PATENT DOCUMENTS

| | | | | |
|---|---|---|---|---|
| 8,043,873 | B2 * | 10/2011 | Fang et al. | ...................... 438/22 |
| 8,101,440 | B2 * | 1/2012 | Fang et al. | ...................... 438/22 |
| 8,334,549 | B2 * | 12/2012 | Lin et al. | ...................... 257/103 |

FOREIGN PATENT DOCUMENTS

| | | |
|---|---|---|
| JP | H08250768 A | 9/1996 |
| JP | H1012921 A | 1/1998 |
| JP | H10229219 A | 8/1998 |
| JP | 2012099820 A | 5/2012 |
| WO | WO-2009102032 A1 | 8/2009 |

* cited by examiner

Primary Examiner — Hsien Ming Lee
(74) Attorney, Agent, or Firm — Moser Taboada (57) ABSTRACT

The disclosure provides a light-emitting diode (LED) and a method for manufacturing the same. The LED includes a first semiconductor layer, a light-emitting layer, a second semiconductor layer, a first current spreading layer, a current blocking having a plurality of nitrogen vacancies, and a second current spreading layer, wherein the second spreading layer includes a current spreading area and a current blocking area. The current blocking area is formed the nitrogen vacancies by high power sputtering on the current blocking area of the second semiconductor layer, so as to increase the resistance of the current blocking area and occur the efficiency of current blocking.

20 Claims, 6 Drawing Sheets

LIGHT-EMITTING DIODE AND METHOD FOR MANUFACTURING THEREOF

RELATED APPLICATIONS

This application claims priority to Taiwan Application Serial Number 102129509 filed Aug. 16, 2013, which is herein incorporated by reference.

BACKGROUND

1. Technical Field

The present disclosure relates to a light-emitting diode and a method for manufacturing thereof, and more particularly, to a light-emitting diode with nitrogen vacancies and a method for manufacturing thereof.

2. Description of Related Art

Figure 1A:
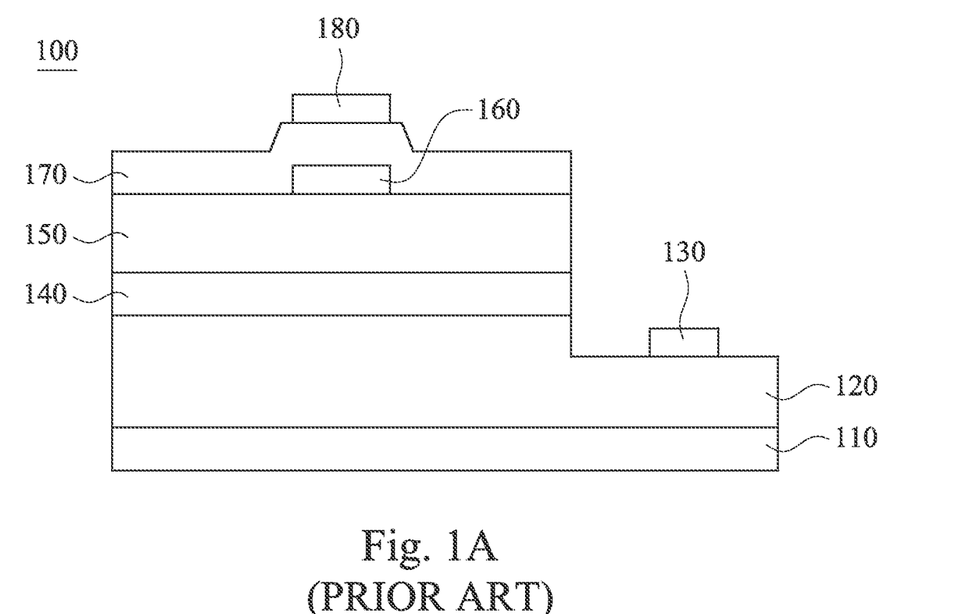
FIG. 1A is a schematic cross-sectional view of a conventional light-emitting diode.

FIG. 1A is a schematic cross-sectional view of a conventional light-emitting diode 100. In FIG. 1A, the light-emitting diode 100 is composed of a substrate 110, an N-type semiconductor layer 120, an N-type metal electrode 130, a light-emitting layer 140, a P-type semiconductor layer 150, a current blocking layer 160, a current spreading layer 170 and a P-type metal electrode 180. In which, the current blocking layer 160 is made of a insulating material and combined with the current spreading layer 170 thereon, so as to increase the current dispersion and the optical uniformity.

Figure 1B:
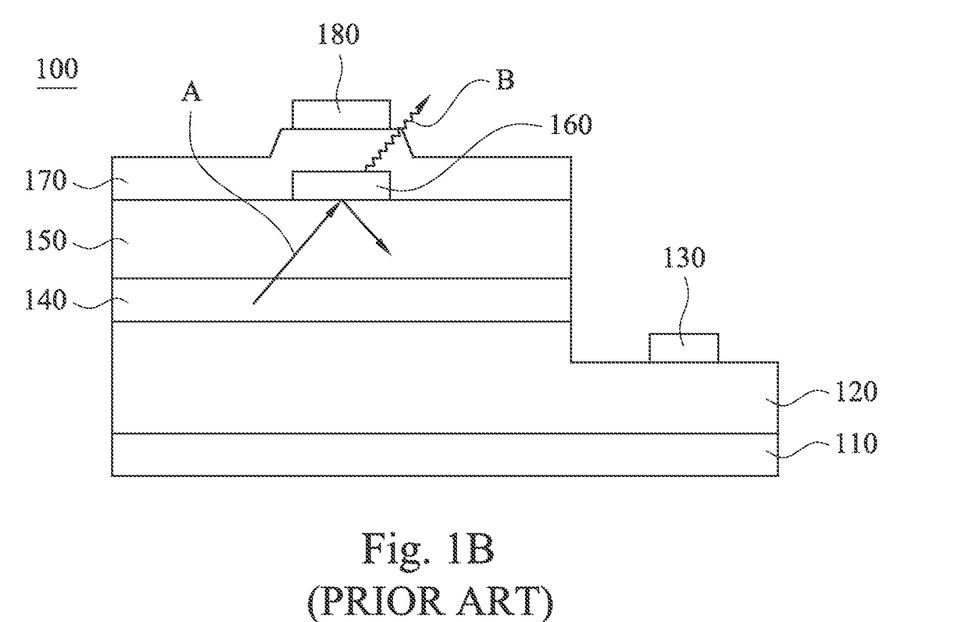
FIG. 1B is a schematic view of part of light in FIG. 1A.

However, for the conventional light-emitting diode, the light transmittance of the material of the current blocking layer is about 93% and thus there is about 7% of brightness loss. In FIG. 1B, when light A emitting from the light-emitting layer 140 goes through the current blocking layer 160, part of its light energy may be absorbed or reflected by the current blocking layer 160, which reduces the brightness of the transmitted light B.

Therefore, there is a need for an improved light-emitting diode and a method for manufacturing thereof, so as to solve the aforementioned problems met in the art.

SUMMARY

The present disclosure provides a light-emitting diode and a method for manufacturing thereof, to solve the problems in the art and enhance the light transmittance of a current blocking layer in a light-emitting diode.

One embodiment of the present disclosure is to provide a light-emitting diode. The light-emitting diode includes a first type semiconductor layer, a light-emitting layer, a second type semiconductor layer, a first current spreading layer, a current blocking layer and a second current spreading layer. In which, the light-emitting layer is formed on the first type semiconductor layer.

The second type semiconductor layer is formed on the light-emitting layer. In which, the second type semiconductor layer includes a current spreading area and a current blocking area, and having a first surface and a second surface opposite to the first surface. The first surface contacts with the light-emitting layer.

The first current spreading layer covers the current spreading area of the second surface, and exposes the current blocking area of the second surface. The current blocking layer has a plurality of nitrogen vacancies, and is formed in the exposed current blocking area of the second surface. The second current spreading layer covers the current blocking layer and the first current spreading layer.

According to one example of the present disclosure, the resistance of the first current spreading layer is r1, and the resistance of the second current spreading layer is r2, where r1>r2.

According to one example of the present disclosure, the distribution of the nitrogen vacancies in the current blocking layer is gradually decreased from the current blocking area of the second surface to the first surface.

According to one example of the present disclosure, the first type semiconductor layer is an N-type semiconductor layer, and the second type semiconductor layer is a P-type semiconductor layer.

According to one example of the present disclosure, the first type semiconductor layer is an N-type gallium nitride, and the second type semiconductor layer is a P-type gallium nitride.

According to one example of the present disclosure, the light-emitting diode further includes a first electrode formed on the second current spreading layer and over the current blocking layer.

According to one example of the present disclosure, the first and second current spreading layers include a transparent conductive material.

According to one example of the present disclosure, the transparent conductive material includes indium tin oxide (ITO), indium gallium oxide (IGO), indium zinc oxide (IZO), indium gallium zinc oxide (IGZO) or a combination thereof.

According to one example of the present disclosure, the light-emitting diode further includes a substrate positioned on another side of the first type semiconductor layer which is not contact with the light-emitting layer.

Another embodiment of the present disclosure is to provide a method for manufacturing a light-emitting diode. The method includes several operations. A substrate is provided. A first type semiconductor layer is formed on the substrate. A light-emitting layer is formed on the first type semiconductor layer. A second type semiconductor layer is formed on the light-emitting layer.

The second type semiconductor layer includes a current spreading area and a current blocking area, and has a first surface and a second surface opposite to the second surface. The first surface contacts the light-emitting layer. A first current spreading layer is formed to cover the current spreading area of the second surface, and to expose the current blocking area of the second surface. A second current spreading layer is formed to cover the first current spreading layer and the exposed second surface, and to transfer the exposed second surface into a current blocking layer with a plurality of nitrogen vacancies.

According to one example of the present disclosure, the resistance of the first current spreading layer is r1, and the resistance of the second current spreading layer is r2, where r1>r2.

According to one example of the present disclosure, the first and second current spreading layer are formed by a sputtering process, and the sputtering power of the second current spreading layer is greater than the sputtering power of the first current spreading layer.

According to one example of the present disclosure, the sputtering process is performed by plasma generated by argon (Ar), nitrous oxide ($N_2O$) or oxygen ($O_2$).

According to one example of the present disclosure, the first and second current spreading layers include a transparent conductive material.

According to one example of the present disclosure, the transparent conductive material includes indium tin oxide (ITO), indium gallium oxide (IGO), indium zinc oxide (IZO), indium gallium zinc oxide (IGZO) or a combination thereof.

According to one example of the present disclosure, the current blocking layer with the nitrogen vacancies is formed by a plurality of sputtering particles with energy which impact the current blocking area of the exposed second surface while the sputtering formation of the second current spreading layer, so that the second surface of the second type semiconductor layer is transformed into the current blocking layer with the nitrogen vacancies.

According to one example of the present disclosure, the distribution of the nitrogen vacancies in the current blocking layer is gradually decreased from the current blocking area of the second surface to the first surface.

According to one example of the present disclosure, the first type semiconductor layer is an N-type semiconductor layer, and the second type semiconductor layer is a P-type semiconductor layer.

According to one example of the present disclosure, the first type semiconductor layer is an N-type gallium nitride, and the second type semiconductor layer is a P-type gallium nitride.

According to one example of the present disclosure, the method further includes a first electrode formed on the second current spreading layer and over the current blocking layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

The embodiments of the transparent conductive structure and a method for manufacturing the same of the present disclosure are discussed in detail below, but not limited the scope of the present disclosure. The same symbols or numbers are used to the same or similar portion in the drawings or the description. And the applications of the present disclosure are not limited by the following embodiments and examples which the person in the art can apply in the related field.

The singular forms "a," "an" and "the" used herein include plural referents unless the context clearly dictates otherwise. Therefore, reference to, for example, a metal layer includes embodiments having two or more such metal layers, unless the context clearly indicates otherwise. Reference throughout this specification to "one embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, the figures are intended; rather, these figures are intended for illustration.

Figure 2:
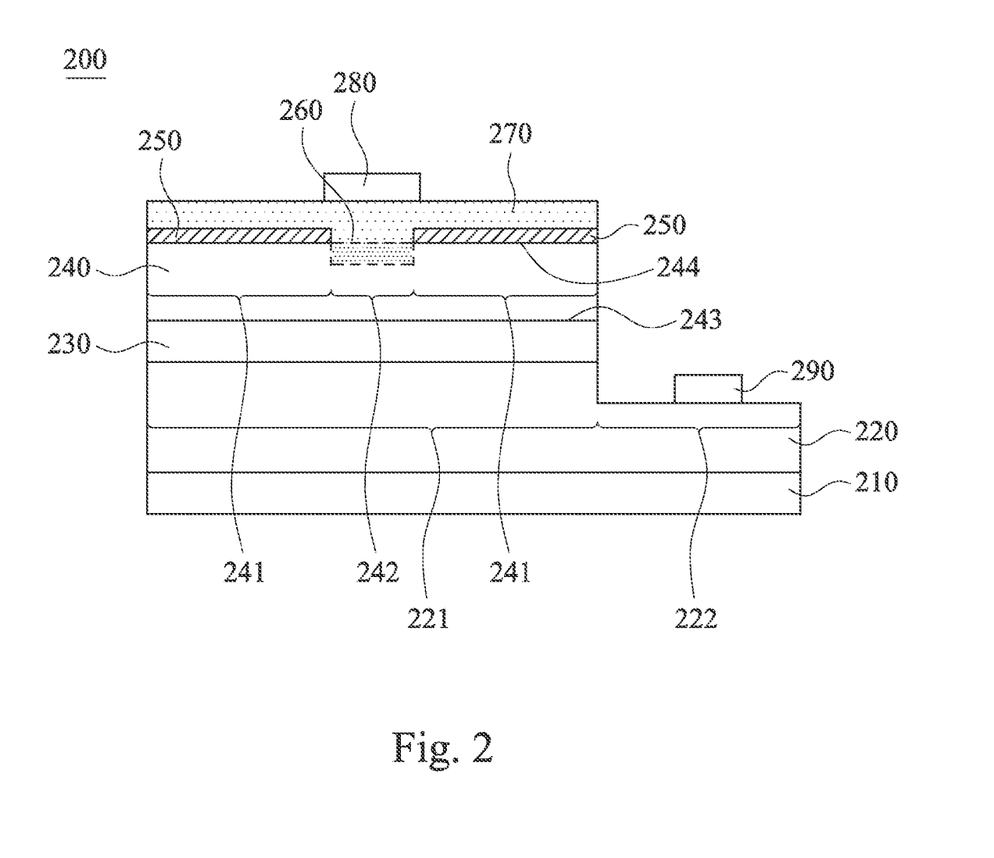
FIG. 2 is a schematic cross-sectional view of a light-emitting diode according to one embodiment of the present disclosure.

FIG. 2 is a schematic cross-sectional view of a light-emitting diode 200 according to one embodiment of the present disclosure. The LED 200 includes a substrate 210, a first type semiconductor layer 220, a light-emitting layer 230, a second type semiconductor layer 240, a first current spreading layer 250, a current blocking layer 260 and a second current spreading layer 270.

In FIG. 2, the first type semiconductor layer 220 is positioned on the substrate 210. The first type semiconductor layer 220 is a mesa structure and includes a first area 221 and a second area 222. The first area 221 is higher than the second area 222.

According to one embodiment of the present disclosure, the first type semiconductor layer is an N-type semiconductor layer. According to one embodiment of the present disclosure, the first type semiconductor layer is made of an N-type gallium nitride.

The light-emitting layer 230 and the second type semiconductor layer 240 are sequentially positioned on the first area 221 of the first type semiconductor layer 220. The second type semiconductor layer 240 includes a current spreading area 241 and a current blocking area 242, and has a first surface 243 and a second surface 244. The first surface 243 is opposite to the second surface 244 and contacts with the light-emitting layer 230.

According to one embodiment of the present disclosure, the second type semiconductor layer is a P-type semiconductor layer. According to one embodiment of the present disclosure, the second type semiconductor layer is made of a P-type gallium nitride. According to one embodiment of the present disclosure, the first type semiconductor layer, the light-emitting layer and the second semiconductor layer are made of III-V semiconductor materials, wherein the light-emitting layer is a III-V compound-based quantum well structure such as gallium nitride (GaN), gallium arsenide (GaAs), gallium phosphide (GaP), gallium arsenic phosphide (GaAsP), aluminum nitride (AlN) or indium nitride (InN).

The first current spreading layer 250 covers the current spreading area 241 of the second surface 244 of the second type semiconductor layer 240, and exposes the current blocking area 242 of the second surface 244. Then, the current blocking layer 260 is formed on the exposed current blocking area 242 of the second surface 244, and has a plurality of nitrogen vacancies. According to one embodiment of the present disclosure, the distribution of the nitrogen vacancies in the current blocking layer is gradually decreased from the current blocking area of the second surface to the first surface. The second current spreading layer 270 covers the current blocking layer 260 and the first current spreading layer 250.

According to one embodiment of the present disclosure, the first and second current spreading layer includes a transparent conductive material such as indium tin oxide (ITO), indium gallium oxide (IGO), indium zinc oxide (IZO), indium gallium zinc oxide (IGZO) or a combination thereof, but not limited. According to one embodiment of the present disclosure, the resistance of the first current spreading layer is r1, and the resistance of the second current spreading layer is r2, where r1>r2.

According to one embodiment of the present disclosure, the LED 200 further includes a first electrode 280 formed on and electrically connected to the second current spreading layer 270, and is over the current blocking layer 260; and a second electrode 290 is formed and electrically connected to the second area 222 of the second type semiconductor layer 220, as shown in FIG. 2. According to one embodiment of the present disclosure, the material of the first and second electrodes may be gold (Au), chromium (Cr), platinum (Pt), titanium (Ti), aluminum (Al), iridium (Ir), rhodium (Rh) or other metals.

According to one embodiment of the present disclosure, the LED 200 further includes a substrate positioned on another side of the first type semiconductor layer which is not contact with the light-emitting layer.

FIGS. 3A-3G are schematic cross-sectional views at various stages of fabricating a light-emitting diode 300 according to one embodiment of the present disclosure.

Figure 3A:
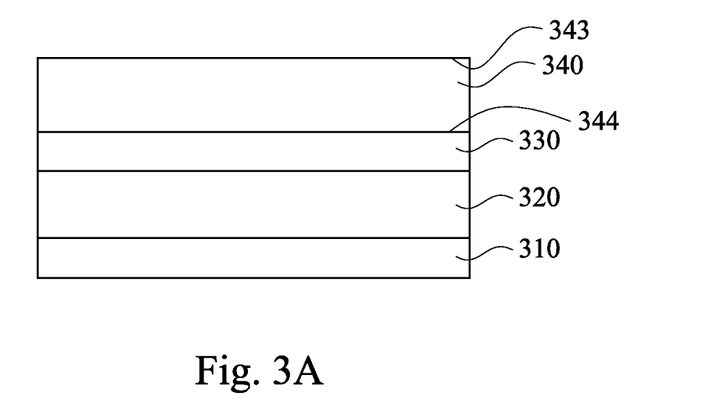
FIGS. 3A-3G are schematic cross-sectional views at various stages of fabricating a light-emitting diode according to one embodiment of the present disclosure.

In FIG. 3A, a second type semiconductor layer 340 is formed on a light-emitting layer 330. In which, a first surface 344 of the second type semiconductor layer 340 contacts with the light-emitting layer 330. The light-emitting layer 330 is formed on a first type semiconductor layer 320, and the first type semiconductor layer 320 is formed on a substrate 310. According to one embodiment of the present disclosure, the substrate includes a silicon substrate or a sapphire substrate, but is not limited. According to one embodiment of the present disclosure, the first type semiconductor layer is an N-type semiconductor layer such as an N-type gallium nitride. According to one embodiment of the present disclosure, the method for forming the first type semiconductor layer includes physical vapor deposition, chemical vapor deposition or epitaxy process. According to one embodiment of the present disclosure, the light-emitting layer is a III-V compound-based quantum well structure such as gallium nitride (GaN), gallium arsenide (GaAs), gallium phosphide (GaP), gallium arsenic phosphide (GaAsP), aluminum nitride (AlN) or indium nitride (InN). According to one embodiment of the present disclosure, the method for forming the light-emitting layer includes epitaxy process. According to one embodiment of the present disclosure, the second type semiconductor layer is a P-type semiconductor layer such as a P-type gallium nitride. According to one embodiment of the present disclosure, the method for forming the second type semiconductor layer includes physical vapor deposition, chemical vapor deposition or epitaxy process.

Figure 3B:
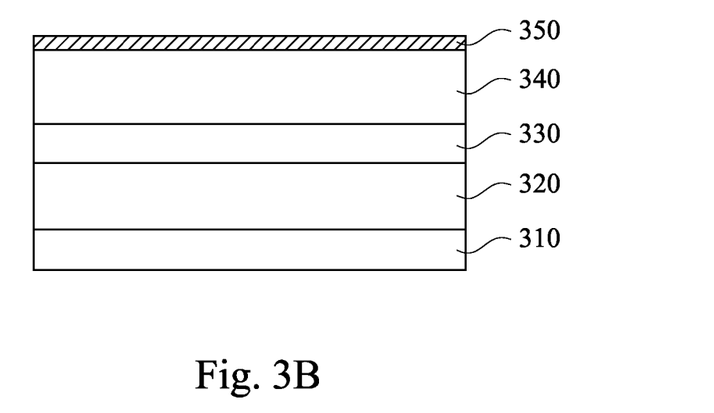

A first current spreading layer 350 is formed on the second surface 343 of the second type semiconductor layer 340, as shown in FIG. 3B. According to one embodiment of the present disclosure, the method for forming the first current spreading layer includes physical vapor deposition, chemical vapor deposition or sputtering process.

Figure 3C:
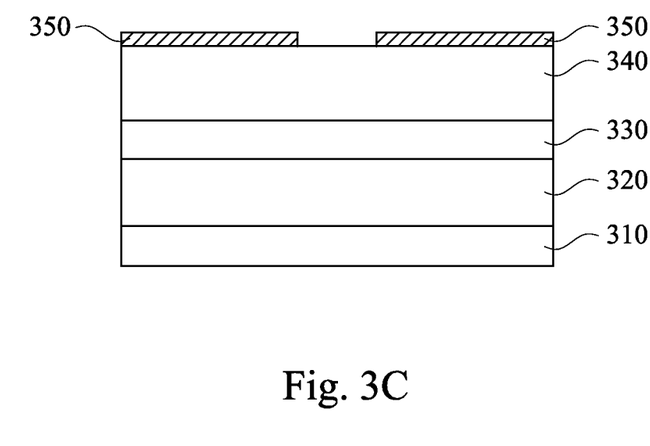

In FIG. 3C, part of the first current spreading layer 350 is removed to expose part of the first surface of the second type semiconductor layer 340. According to one embodiment of the present disclosure, a lithography and etching process is further applied to pattern the first current spreading layer, so as to expose the current blocking area of the second type semiconductor layer.

Figure 3D:
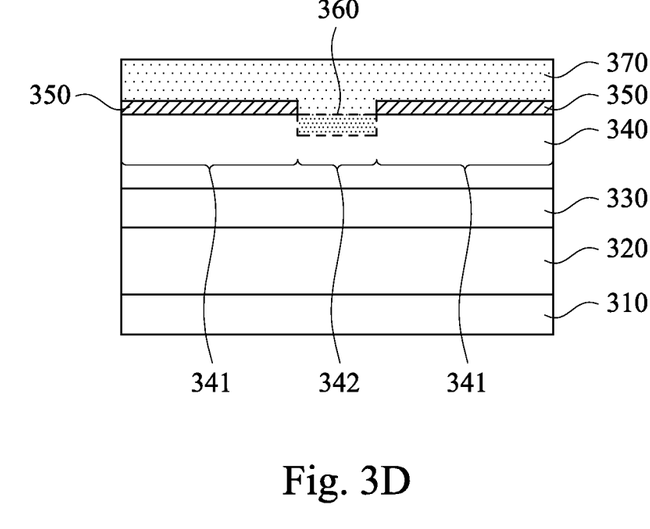

A second current spreading layer 370 is formed over the first current spreading layer 350 and the exposed second surface of the second type semiconductor layer 340, so that the exposed second surface may is transformed into a current blocking layer 360 with a plurality of nitrogen vacancies, as shown in FIG. 3D.

In FIG. 3D, the second type semiconductor layer 340 is divided into a current spreading area 341 and a current blocking area 342. When the nitrogen vacancies is generated in the surface of the second type semiconductor layer to increase the electron concentration therein, the exceed electrons may occur compensation effect with the hole in the second type semiconductor material, so that the contact resistance between the transparent conductive material and the second type semiconductor material may be increased to form the current blocking layer with nitrogen vacancies. According to one embodiment of the present disclosure, the distribution of the nitrogen vacancies in the current blocking layer is gradually decreased from the current blocking area of the second surface to the first surface.

According to one embodiment of the present disclosure, the current blocking layer with nitrogen vacancies is formed by a high-power sputtering process. A plurality of sputtering particles with energy impact the current blocking area of the exposed second surface while the sputtering formation of the second current spreading layer, so that the second surface of the second type semiconductor layer is transformed into the current blocking layer with nitrogen vacancies. According to one embodiment of the present disclosure, the sputtering process is performed by plasma generated by argon (Ar), nitrous oxide ($N_2O$) or oxygen ($O_2$).

According to one embodiment of the present disclosure, the first and second current spreading layers are formed by a sputtering process; and the sputtering power of the second current spreading layer is greater than the sputtering power of the first current spreading layer. According to one embodiment of the present disclosure, the first and second current spreading layers include a transparent conductive material such as indium tin oxide (ITO), indium gallium oxide (IGO), indium zinc oxide (IZO), indium gallium zinc oxide (IGZO) or a combination thereof, but not limited.

Figure 3E:
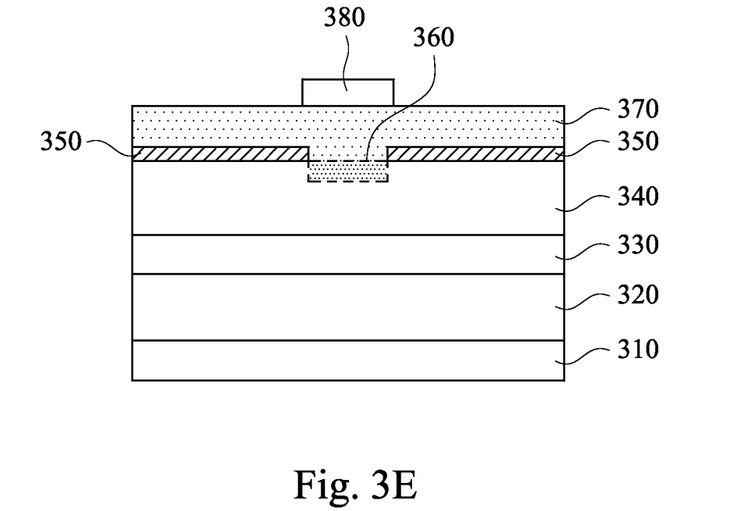

In FIG. 3E, a first electrode 380 is formed on the second current spreading layer 370. The first electrode 380 is electrically connected to the second current spreading layer 370 and over the current blocking layer 360.

According to one embodiment of the present disclosure, the material of the first and second electrodes may be gold (Au), chromium (Cr), platinum (Pt), titanium (Ti), aluminum (Al), iridium (Ir), rhodium (Rh) or other metals. According to one embodiment of the present disclosure, the first and second electrodes are formed by sputtering process or deposition process.

Figure 3F:
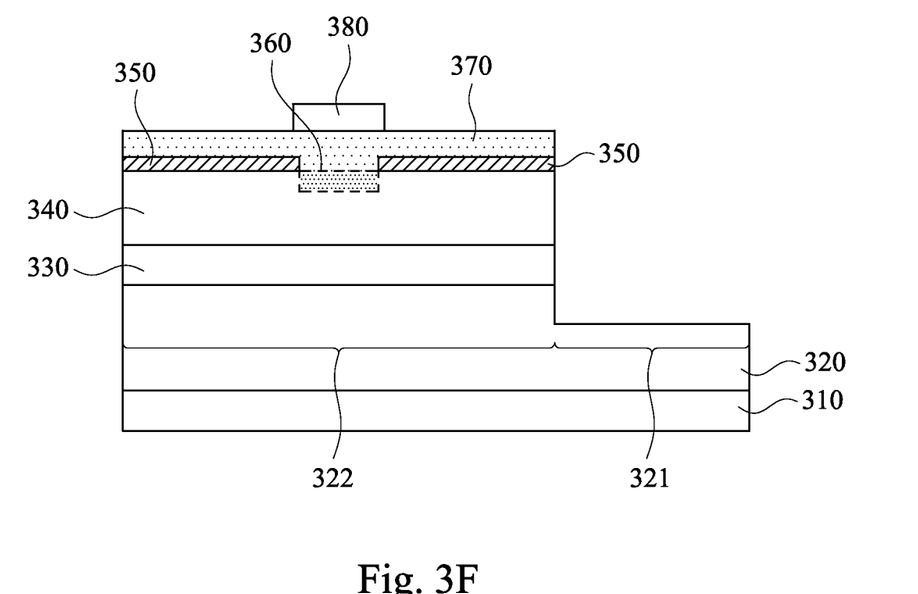

In FIG. 3F, the first type semiconductor layer 320 has a first area 321 and a second area 322. On the first area 321 of the first type semiconductor layer 320, part of the first type semiconductor material, the light-emitting layer 330, the second type semiconductor layer 340, the first current spreading layer 350 and the second current spreading layer 370 are removed to provide a mesa structure.

Figure 3G:
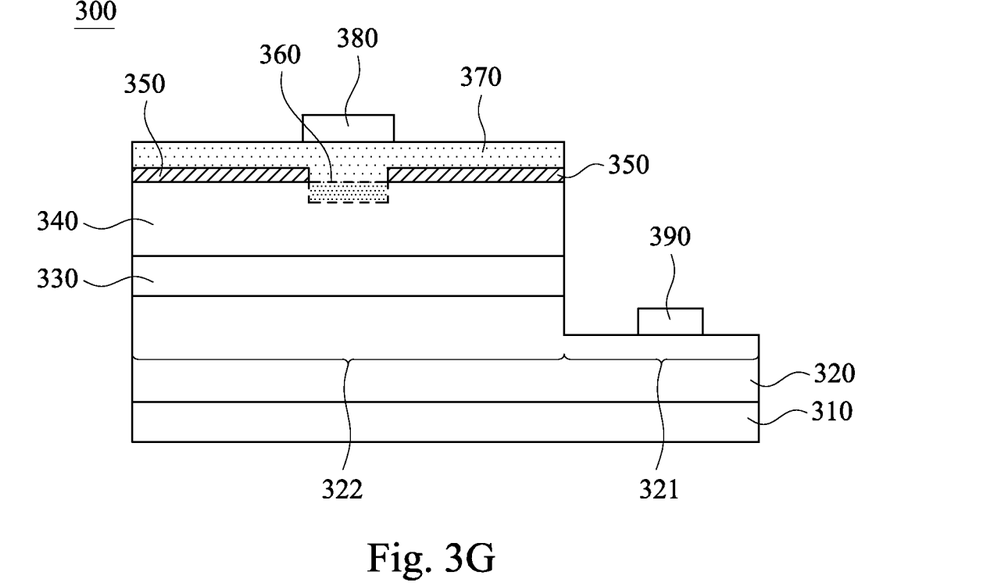

Then, a second electrode 390 is formed on the first area 321 of the first type semiconductor layer 320 to give the LED 300 with a mesa structure, as shown in FIG. 3G.

Figure 4:
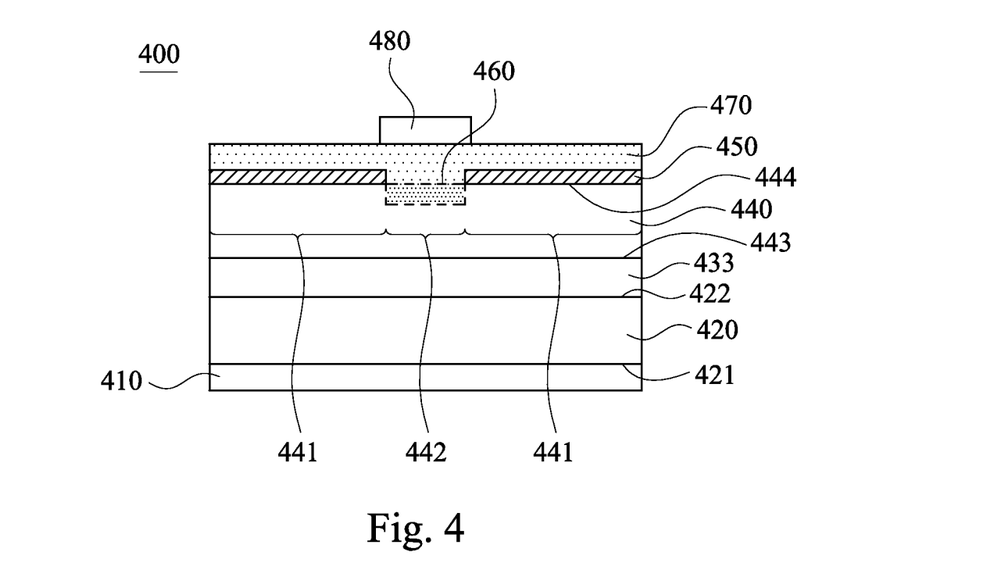
FIG. 4 is a schematic cross-sectional view of a light-emitting diode according to one embodiment of the present disclosure.

FIG. 4 is a schematic cross-sectional view of a light-emitting diode 400 according to one embodiment of the present disclosure. The LED 400 includes a first electrode 410, a first type semiconductor layer 420, a light-emitting layer 430, a second type semiconductor layer 440, a first current spreading layer 450, a current blocking layer 460, a second current spreading layer 470 and a second electrode 480.

In FIG. 4, the first type semiconductor layer 420 has a first surface 421 and a second surface 422 opposite to the first surface 421. The first electrode 410 is formed and electrically connected to the first surface 421 of the first type semiconductor layer 420.

According to one embodiment of the present disclosure, the first type semiconductor layer is an N-type semiconductor layer. According to one embodiment of the present disclosure, the first type semiconductor layer is made of an N-type gallium nitride.

The light-emitting layer 430 and the second type semiconductor layer 440 are sequentially formed on the second surface 422 of the first type semiconductor layer 420. The second type semiconductor layer 440 includes a current spreading area 441 and a current blocking area 442, and has a first surface 443 and a second surface 444 opposite to the first surface 443. The first surface 443 of the second type semiconductor layer 440 contacts with the light-emitting layer 430.

According to one embodiment of the present disclosure, the second type semiconductor layer is a P-type semiconductor layer. According to one embodiment of the present disclosure, the second type semiconductor layer is made of a P-type gallium nitride.

The first current spreading layer 450 covers the current spreading area 441 of the second surface 444 of the second type semiconductor layer 440, and exposes the current blocking area 442 of the second surface 444. Then, the current blocking layer 460 is formed on the exposed current blocking area 442 of the second surface 444, and has a plurality of nitrogen vacancies. According to one embodiment of the present disclosure, the distribution of the nitrogen vacancies in the current blocking layer is gradually decreased from the current blocking area of the second surface to the first surface. The second current spreading layer 470 covers the current blocking layer 460 and the first current spreading layer 450. The second electrode 480 is formed on and electrically connected to the second current spreading layer 470 and over the current blocking layer 460.

According to one embodiment of the present disclosure, the first and second current spreading layer includes a transparent conductive material such as indium tin oxide (ITO), indium gallium oxide (IGO), indium zinc oxide (IZO), indium gallium zinc oxide (IGZO) or a combination thereof, but not limited. According to one embodiment of the present disclosure, the resistance of the first current spreading layer is r1, and the resistance of the second current spreading layer is r2, where r1>r2.

Because the material of the current blocking layer of the conventional LED is usually formed of silicon oxide ($SiO_2$), which may absorb part of light, the decreasing light transmittance may reduce the LED brightness. However, the material of the current blocking layer of the LED according to the present disclosure is a virtual second type semiconductor material with nitrogen vacancies, so that the light energy may not be absorbed to reduce light transmittance.

On the other hand, because the current blocking area with nitrogen vacancies is not a complete insulator, a little of current may flow through the current blocking area, exciting the light-emitting layer under the current blocking area. Therefore, the LED according to the present disclosure is not only able to enhance the light transmittance, but also increase the light-emitting efficiency and thus increase the average brightness thereof.

Although embodiments of the present disclosure and their advantages have been described in detail, they are not used to limit the present disclosure. It should be understood that various changes, substitutions and alterations can be made herein without departing from the spirit and scope of the present disclosure. Therefore, the protecting scope of the present disclosure should be defined as the following claims.

What is claimed is:

1. A light-emitting diode, comprising:
a first type semiconductor layer;
a light-emitting layer formed on the first type semiconductor layer;
a second type semiconductor layer formed on the light-emitting layer, the second type semiconductor layer having a current spreading area and a current blocking area, and having a first surface and a second surface opposite to the first surface, wherein the first surface is in contact with the light-emitting layer;
a first current spreading layer covering the current spreading area of the second surface, and exposing the current blocking area of the second surface;
a current blocking layer with a plurality of nitrogen vacancies formed on the exposed current blocking area of the second surface; and
a second current spreading layer covering the current blocking layer and the first current spreading layer.

2. The light-emitting diode of claim 1, wherein the resistance of the first current spreading layer is r1, and the resistance of the second current spreading layer is r2, wherein r1>r2.

3. The light-emitting diode of claim 2, wherein the distribution of the nitrogen vacancies in the current blocking layer gradually decreases from the second surface to the first surface in the current blocking area.

4. The light-emitting diode of claim 1, wherein the first type semiconductor layer is an N-type semiconductor layer, and the second type semiconductor layer is a P-type semiconductor layer.

5. The light-emitting diode of claim 4, wherein the first type semiconductor layer is an N-type gallium nitride, and the second type semiconductor layer is a P-type gallium nitride.

6. The light-emitting diode of claim 1, further comprising a first electrode formed on the second current spreading layer and over the current blocking layer.

7. The light-emitting diode of claim 1, wherein the first and second current spreading layer comprises a transparent conductive material.

8. The light-emitting diode of claim 7, wherein the transparent conductive material comprises indium tin oxide (ITO), indium gallium oxide (IGO), indium zinc oxide (IZO), indium gallium zinc oxide (IGZO) or a combination thereof.

9. The light-emitting diode of claim 1, further comprising a substrate positioned on another side of the first type semiconductor layer which is not in contact with the light-emitting layer.

10. A method for manufacturing a light-emitting diode, comprising:
providing a substrate;
forming a first type semiconductor layer on the substrate;
forming a light-emitting layer on the first type semiconductor layer;
forming a second type semiconductor layer on the light-emitting layer, the second type semiconductor layer having a current spreading area and a current blocking area, and having a first surface and a second surface opposite to the first surface, wherein the first surface is in contact with the light-emitting layer;
forming a first current spreading layer over the current spreading area of the second surface and exposing the current blocking area of the second surface; and
forming a second current spreading layer over the first current spreading layer and the exposed current blocking area of the second surface, and transforming the exposed current blocking area of the second surface into a current blocking layer with a plurality of nitrogen vacancies.

11. The method of claim 10, wherein the resistance of the first current spreading layer is r1, and the resistance of the second current spreading layer is r2, wherein r1>r2.

12. The method of claim 11, wherein the first and second current spreading layers are formed by a sputtering process, and a sputtering power of the second current spreading layer is greater than a sputtering power of the first current spreading layer.

13. The method of claim 12, wherein the sputtering process is performed by plasma generated by argon (Ar), nitrous oxide (N2O) or oxygen (O2).

14. The method of claim 12, wherein the current blocking layer with the nitrogen vacancies is formed by a plurality of sputtering particles with energy which impact the exposed current blocking area of the second surface in the formation of the second current spreading layer by the sputtering process, so that the exposed current blocking area of the second surface is transformed into the current blocking layer with the nitrogen vacancies.

15. The method of claim 14, wherein the distribution of the nitrogen vacancies in the current blocking layer is gradually decreased from the first surface in the current blocking area.

16. The method of claim 11, wherein the first and second current spreading layers comprise a transparent conductive material.

17. The method of claim 16, wherein the transparent conductive material comprises indium tin oxide (ITO), indium gallium oxide (IGO), indium zinc oxide (IZO), indium gallium zinc oxide (IGZO) or a combination thereof.

18. The method of claim 10, wherein the first type semiconductor layer is an N-type semiconductor layer, and the second type semiconductor layer is a P-type semiconductor layer.

19. The method of claim 18, wherein the first type semiconductor layer is an N-type gallium nitride, and the second type semiconductor layer is a P-type gallium nitride.

20. The method of claim 10, further comprising a first electrode formed on the second current spreading layer and over the current blocking layer.

* * * * *